(12) United States Patent
Volianskii et al.

(10) Patent No.: US 12,088,319 B2
(45) Date of Patent: Sep. 10, 2024

(54) MULTIPATH D/A CONVERTER

(71) Applicant: Rohde & Schwarz GmbH & Co. KG, Munich (DE)

(72) Inventors: Mikhail Volianskii, Mering (DE); Marcus Bueche, Olching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 183 days.

(21) Appl. No.: 17/853,399

(22) Filed: Jun. 29, 2022

(65) Prior Publication Data

US 2024/0007123 A1 Jan. 4, 2024

(51) Int. Cl.
*H03M 1/66* (2006.01)

(52) U.S. Cl.
CPC .................................. *H03M 1/662* (2013.01)

(58) Field of Classification Search
CPC .............................. H03M 1/121; H03M 1/662
See application file for complete search history.

(56) References Cited

U.S. PATENT DOCUMENTS

| | | | | |
|---|---|---|---|---|
| 4,990,867 A * | 2/1991 | Ogura | ................. | H04L 27/2071 332/102 |
| 5,717,715 A * | 2/1998 | Claydon | ........... | H04L 25/03866 375/220 |
| 6,240,098 B1 * | 5/2001 | Thibault | ............... | H04W 88/08 455/562.1 |
| 6,271,782 B1 * | 8/2001 | Steensgaard-Madsen | ................... | H03M 3/46 341/143 |
| 7,312,737 B2 | 12/2007 | Jungerman et al. | | |
| 7,889,111 B2 * | 2/2011 | Kawahito | ............. | H03M 1/144 341/172 |
| 8,164,501 B2 | 4/2012 | Venes et al. | | |
| 8,564,471 B1 * | 10/2013 | Gao | ...................... | G04F 10/005 341/166 |
| 8,618,969 B2 | 12/2013 | Wyville | | |
| 8,803,720 B2 * | 8/2014 | Dufrene | .................. | H03F 3/245 341/147 |
| 8,928,519 B2 * | 1/2015 | Karthaus | ............... | H03M 3/508 341/173 |
| 9,093,955 B2 * | 7/2015 | Carlson | ................. | H03M 1/662 |
| 9,543,975 B1 * | 1/2017 | Melanson | ................ | H04R 3/04 |
| 9,780,800 B1 * | 10/2017 | Satoskar | ............. | H03M 1/0612 |
| 10,069,483 B1 * | 9/2018 | Zanbaghi | ............ | H03M 1/1245 |
| 10,141,946 B1 * | 11/2018 | Zanbaghi | ............. | H03H 19/004 |
| 10,644,716 B1 * | 5/2020 | Luo | ......................... | H03M 1/68 |
| 2005/0083220 A1 * | 4/2005 | Siferd | ................... | H03M 3/344 341/143 |

(Continued)

FOREIGN PATENT DOCUMENTS

EP 2 521 268 B1 9/2015

*Primary Examiner* — Lam T Mai

(74) *Attorney, Agent, or Firm* — DITTHAVONG, STEINER, & MLOTKOWSKI

(57) ABSTRACT

A Multipath D/A converter device is proposed having input terminals for a least a first and a second digital signal path, in at least one of the at least one first and second signal path, means for inverting every second sample of the digital signal, and each signal path comprising a D/A converter. The D/A converter of all signal paths are designed to operate at the same phase. The multipath converter device includes an analog combining unit designed for combining the analog signals output by each of the D/A converter.

11 Claims, 2 Drawing Sheets

(56) References Cited

U.S. PATENT DOCUMENTS

| | | | | |
|---|---|---|---|---|
| 2006/0244528 A1* | 11/2006 | Pickerd | ............... | G01R 13/0272 |
| | | | | 330/126 |
| 2007/0120724 A1* | 5/2007 | Hori | ................... | H03M 1/0626 |
| | | | | 341/156 |
| 2009/0052556 A1* | 2/2009 | Fernandez | ............ | H03M 1/662 |
| | | | | 375/240 |
| 2012/0128099 A1* | 5/2012 | Morris | ................... | H04L 25/08 |
| | | | | 29/832 |
| 2014/0327561 A1* | 11/2014 | Wloczysiak | ............ | H04L 25/02 |
| | | | | 341/144 |
| 2016/0065312 A1* | 3/2016 | Oyama | ............... | H04B 10/6971 |
| | | | | 398/194 |
| 2018/0309420 A1* | 10/2018 | La Grou | ................... | H03F 3/68 |
| 2024/0007124 A1* | 1/2024 | Volianskii | ............. | H03M 1/662 |

* cited by examiner

MULTIPATH D/A CONVERTER

TECHNICAL FIELD

The invention is in the field of multipath D/A converter.

BACKGROUND ART

EP 2 521 268 B1 discloses a data converter system that avoids interleave images and distortion products.

U.S. Pat. No. 8,618,969B2 discloses a multi-DAC system includes a plurality of DACs arranged in parallel for converting a digital signal to an analog signal, each DAC path having a different analog phase response.

U.S. Pat. No. 7,312,737 B2 discloses a digital-to-analog converting system for producing an interleaved analog signal with enhanced bandwidth, wherein the system includes a first digital-to-analog converter for receiving a first digital data stream and converting the first digital data stream to a first analog signal and a second digital-to-analog converter for receiving a second digital data stream and converting the second digital data stream to a second analog signal.

U.S. Pat. No. 8,164,501 B2 discloses a transmitter and a communication system including a plurality of digital-to-analog converters. Furthermore, a plurality of clocks is provided, each being communicably coupled to a corresponding one of the digital-to-analog converters.

QMF-based D/A converters are known from Miao, Clements Digital Signal Processing and Statistical classification, ISBN 1-58053-135-0, see for example FIG. 8, 21.

SUMMARY OF THE INVENTION

The present invention targets at an improved multipath D/A converter.

A Multipath D/A converter device is proposed, having:
input terminals for a least a first and a second digital signal path,
in at least one of said at least one first and second signal path, means for inverting every second sample of the digital signal, and
each signal path comprising a D/A converter, wherein the D/A converter of all signal paths are designed to operate at the same phase,
the multipath converter device furthermore comprising an analog combining unit designed for combining the analog signals output by each of said D/A converter.

A Multipath D/A converter device is proposed, having:
input terminals for a least a first and a second digital signal path,
in at least one of said at least one first and second signal path, means for multiplying the digital signal with a cosine shape function,
each signal path comprising a D/A converter, wherein the D/A converter of all signal paths are designed to operate at the same phase,
the multipath converter device furthermore comprising an analog combining unit designed for combining the analog signals output by each of said D/A converter.

In each signal path a down-sampling unit may be provided upstream the D/A converter.

The converter may comprise a splitter for splitting an input digital signal path into said first and second digital signal paths.

In at least one or each signal path an analogue filter unit may be provided following the respective D/A converter.

In at least one or each signal path a digital filter unit may be provided upstream the respective D/A converter.

Digital filter coefficients of said digital filter are set as a function of the state of the means for inverting every second sample of the digital signal in each signal path and the means for multiplying the digital signal in each signal path with a cosine shape function, respectively.

Digital filter coefficients of said digital filter are set as a function of the state of the means for inverting every second sample of the same or a different digital signal path, and the means for multiplying the digital signal in the same or a different signal path with a cosine shape function, respectively.

At least one or all digital filter may be low-pass filter. Preferably there are no high-pass filter.

The D/A converter of at least one signal path may be arranged to operate with a different pulse shape than the D/A converter of at least one other signal path.

The D/A converter of at least one signal path may be arranged to operate with a NRZ pulse and the D/A converter of at least one other signal path is arranged to operate with a RF pulse.

The D/A converter of at least two, preferably all signal paths are designed to operate at the same frequency.

BRIEF DESCRIPTION OF THE DRAWINGS

Aspects of the invention will now be explained with reference to the figures of the enclosed drawings.

DETAILED DESCRIPTIONS OF EMBODIMENTS

Figure 1:
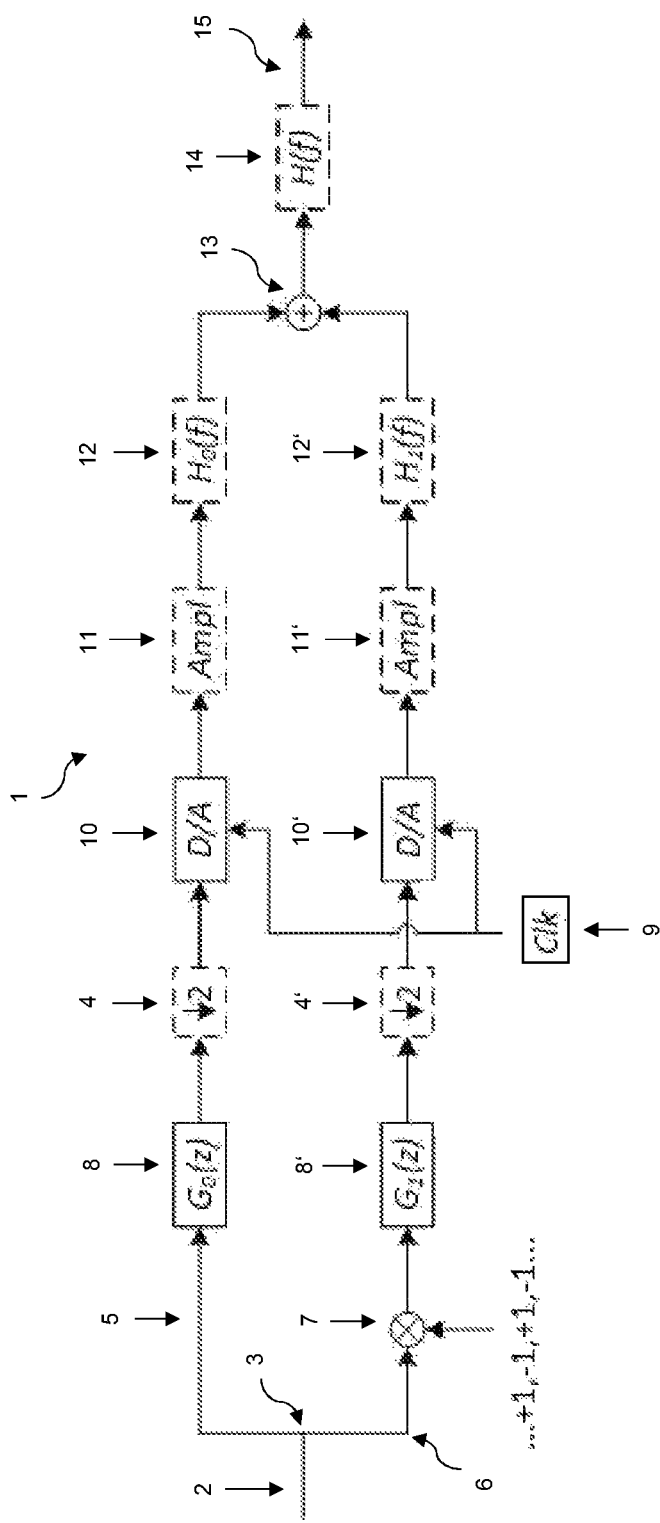
FIG. 1 shows a multipath D/A converter according to a first example.

FIG. 1 shows a first example of the invention. A digital signal 2 is split by a signal splitter 3 into two digital signal paths 5, 6. Each of the digital signal paths 5, 6 is provided with a respective D/A converter 10, 10'. The D/A converter 10, 10' are supplied with a clock signal from a common clock 9.

Thus, the D/A converter 10, 10' of different signal paths 5, 6 are operated at the same phase and preferably also at the same frequency.

The analog output signals of the D/A converter 10, 10' may be subjected to an amplification stage 11, 11'. The amplified signals may be filtered by respective analog filter 12, 12'.

The analog signals are then combined in a combining unit 13. The combined signal might be subjected to a (further) analog filtering stage 14 before being supplied to an output terminal 15.

On the digital side (upstream of the D/A converter 10, 10') digital filters 8, 8' may be provided in at least one, a multitude or each of the digital signal paths 5, 6. These digital filters 8, 8' are preferably low-pass filter. Preferably, at least on the digital side of the signal paths 5, 6 no high-pass filter is present.

On the digital side of the signal paths 5, 6 down-sampling units 4, 4' may be present. As shown in FIG. 1, these down-sampling units 4, 4' may be preferably arranged between the output side of the digital filter 8, 8' and the input to the D/A converter 10, 10'. However, also other arrangements of the elements on the digital side and/or the analog side of the signal paths 5, 6 other than shown in FIG. 1 are possible.

As shown in example of FIG. 1 a multiplication unit 7 may be provided in at least one of the signal paths 6.

In the example of FIG. 1, this multiplication unit 7 is arranged to multiply the incoming digital signal (here in the signal path 6) such that the sign of every second sample is inverted. This is schematically indicated by the following sequence of multiplication factors used by the multiplication unit:

..., +1, −1, +1, −1, ....

This can also be achieved by multiplying the digital input signal 6 with a signal having the shape of a cosine shape, such that the peak values +1 and −1 of the cosine shape signal are applied as multiplication factors for consecutive samples of the digital signal.

Figure 2:
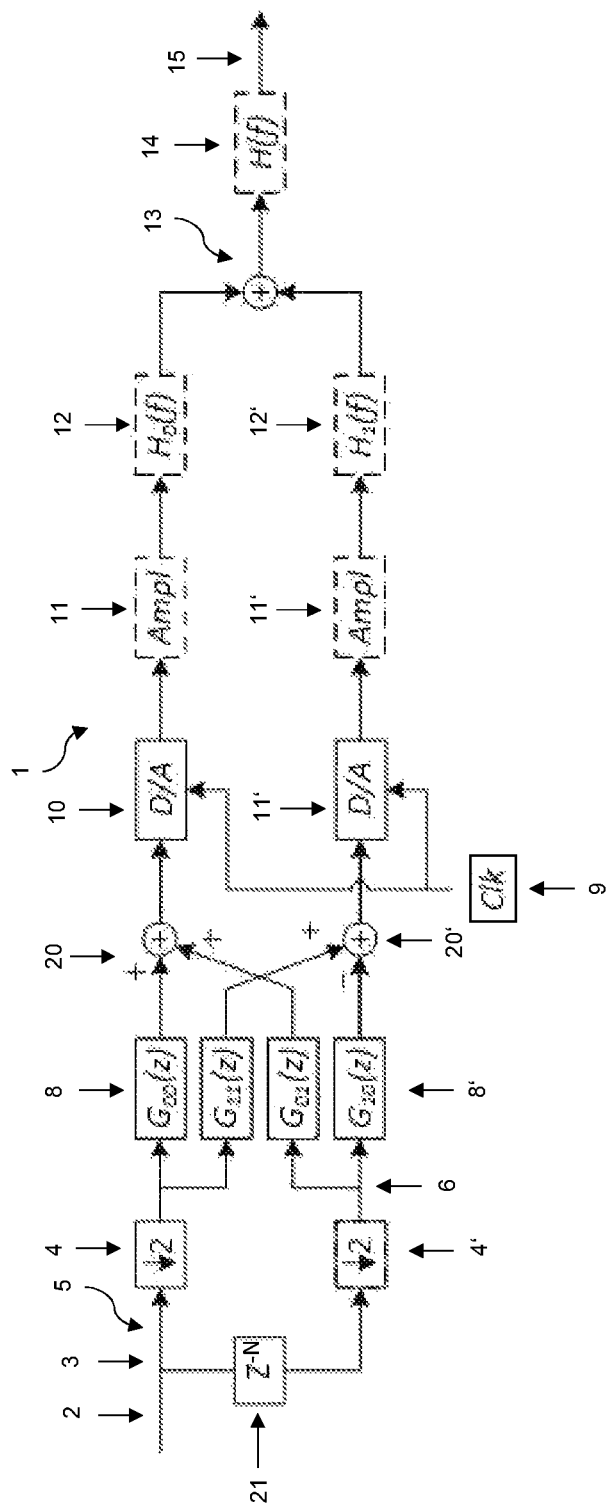
FIG. 2 shows a multipath D/A converter according to a second example

FIG. 2 shows a further example of the invention.

All elements having the same reference numerals as in FIG. 1 designate the same technical units.

As can be seen in FIG. 2 it may be foreseen that the signal (preferably the down-sampled signal version) of each digital signal path 5, 6 is subjected to a first digital filtering $G_{00(Z)}$ which is combined, in a combination stage 20, with a digitally filtered version of the digital signal of the respectively other digital signal path 6. The digital signal of the other digital signal path 6 is subjected to a filter $G_{01(Z)}$ before being combined, in the combination unit 20, with a digital filtered digital signal of the first digital signal path 5.

In the same manner, a digital filtered version (filter stage Gi) of the digital signal in the first digital signal path 5 may be combined, in a further combination stage 20', with a digitally filtered version (digital filter $G_{10(Z)}$) of the digital signal of the digital signal path 6.

According to an aspect of the invention, the digital filtering in the digital filtering stages 8, 8' in FIG. 1 and FIG. 2 may be set depending on the current status of the multiplying stage 7, i.e. dependent on the current value (especially current sign) applied by the multiplying stage 7.

Thus, the coefficients of the digital filter stages 8, 8' in the examples of FIG. 1 and FIG. 2 may vary over time in line with the time variation (sample variation) of the operation of the multiplying stage 7.

The invention claimed is:

1. Multipath D/A converter device, having:
    input terminals for a least a first and a second digital signal path:
        in at least one of said at least one first and second signal path, means for inverting every second sample of the digital signal, and
        each signal path comprising a D/A converter, wherein the D/A converter of all signal paths are designed to operate at the same phase,
        wherein in each signal path a downs-sampling unit is provided upstream the D/A converter,
    the multipath converter device furthermore comprising an analog combining unit designed for combining the analog signals output by each of said D/A converter.

2. The converter of claim 1,
    wherein the converter comprises a splitter for splitting an input digital signal path into said first and second digital signal paths.

3. The converter of claim 1,
    wherein in at least one or each signal path an analogue filter unit is provided following the respective D/A converter.

4. The converter of claim 1,
    wherein in at least one or each signal path an digital filter unit is provided upstream the respective D/A converter.

5. The converter of claim 4,
    wherein digital filter coefficients of said digital filter are set as a function of the state of the means for inverting every second sample of the digital signal in each signal path and the means for multiplying the digital signal in each signal path with a cosine shape function, respectively.

6. The converter of claim 5,
    wherein digital filter coefficients of said digital filter are set as a function of the state of the means for inverting every second sample of the same or a different digital signal path, and the means for multiplying the digital signal in the same or a different signal path with a cosine shape function, respectively.

7. The converter of claim 4,
    wherein at least one or all digital filter are low-pass filter.

8. The converter of claim 1,
    Wherein the D/A converter of at least two, preferably all signal paths are designed to operate at the same frequency.

9. Multipath D/A converter device, having:
    input terminals for a least a first and a second digital signal path:
        in at least one of said at least one first and second signal path, means for multiplying the digital signal with a cosine shape function,
        each signal path comprising a D/A converter, wherein the D/A converter of all signal paths are designed to operate at the same phase,
    wherein in each signal path a downs-sampling unit is provided upstream the D/A converter,
    the multipath converter device furthermore comprising an analog combining unit designed for combining the analog signals output by each of said D/A converter.

10. Multipath D/A converter device, having:
    input terminals for a least a first and a second digital signal path:
        in at least one of said at least one first and second signal path, means for inverting every second sample of the digital signal, and
        each signal path comprising a D/A converter, wherein the D/A converter of all signal paths are designed to operate at the same phase,
    the multipath converter device furthermore comprising an analog combining unit designed for combining the analog signals output by each of said D/A converter,
    wherein the D/A converter of at least one signal path is arranged to operate with a different pulse shape than the D/A converter of at least one other signal path.

11. The converter of claim 10,
    wherein the D/A converter of at least one signal path is arranged to operate with a NRZ pulse and the D/A converter of at least one other signal path is arranged to operate with a RF pulse.

* * * * *